US008354716B2

(12) United States Patent
Huang et al.

(10) Patent No.: US 8,354,716 B2
(45) Date of Patent: Jan. 15, 2013

(54) SEMICONDUCTOR DEVICES AND METHODS OF MANUFACTURING THE SAME

(75) Inventors: Hsueh I Huang, Lin-Yuan Township, Kaohsiung County (TW); Ming-Tung Lee, Longtan Shiang (TW); Shyi-Yuan Wu, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 178 days.

(21) Appl. No.: 12/830,178

(22) Filed: Jul. 2, 2010

(65) Prior Publication Data
US 2012/0001260 A1    Jan. 5, 2012

(51) Int. Cl.
*H01L 29/76*    (2006.01)
(52) U.S. Cl. ......... 257/342; 257/339; 257/327; 257/335
(58) Field of Classification Search .......... 438/353–357, 438/201, 207, 262, 265; 257/347, 368, 514, 257/544, 584, 341, 343, 339, 327, 335
See application file for complete search history.

(56) References Cited

U.S. PATENT DOCUMENTS

| 5,859,457 | A  | * | 1/1999  | Thiel et al. ............... 257/335 |
| 6,168,983 | B1 | * | 1/2001  | Rumennik et al. ........ 438/188 |
| 6,729,886 | B2 | * | 5/2004  | Efland et al. ............. 438/207 |
| 6,894,348 | B2 | * | 5/2005  | Terashima ................ 257/339 |
| 7,126,191 | B2 | * | 10/2006 | Fujii ........................ 257/339 |
| 2010/0078709 | A1 | * | 4/2010 | Ogura ....................... 257/328 |

* cited by examiner

*Primary Examiner* — Steven Loke
*Assistant Examiner* — David Goodwin
(74) *Attorney, Agent, or Firm* — Alston & Bird LLP

(57) ABSTRACT

A semiconductor device for use in a relatively high voltage application that comprises a substrate, a first n-type well region in the substrate to serve as a high voltage n-well (HVNW) for the semiconductor device, a pair of second n-type well regions in the first n-type well region, a p-type region in the first n-type well region between the second n-type well regions, a pair of conductive regions on the substrate between the second n-type well regions, and a number of n-type regions to serve as n-type buried layers (NBLs) for the semiconductor device, wherein the NBLs are located below the first n-type region and dispersed in the substrate.

15 Claims, 9 Drawing Sheets

SEMICONDUCTOR DEVICES AND METHODS OF MANUFACTURING THE SAME

BACKGROUND OF THE INVENTION

The present invention relates generally to a semiconductor device and, more particularly, to a semiconductor transistor device and a method of manufacturing the same.

Power transistors such as lateral (double) diffused metal-oxide-semiconductor (LDMOS) transistors and drain extension MOS (DEMOS) transistors are generally used in high-voltage applications. It is desirable that a power transistor is designed with a relatively high breakdown voltage and a relatively low on-resistance. However, high breakdown voltage and low on-resistance may be a trade-off for a power transistor. FIG. 1 is a layout of an LDMOS device 100 in prior art. Referring to FIG. 1, the LDMOS device 100 may include a high voltage n-type well (HVNW) region 101, a pair of n-type well regions 102 in the HVNW 101 and an n-type buried layer (NBL) 103 between the NW regions 102. The LDMOS 100 may be designed with a breakdown voltage (BV) of, for example, 60V (volts) for a 40V application. To reduce the on-resistance of the LDMOS device 100, an attempt to increase the concentration of the HVNW 101 may result in a decrease in the breakdown voltage, which may not be acceptable.

It may therefore be desirable to have a semiconductor device that has a relatively low on-resistance without compromise of the breakdown voltage.

BRIEF SUMMARY OF THE INVENTION

The present invention is directed to a semiconductor device and a method of manufacturing the same that may achieve a relatively low on-resistance.

Examples of the present invention may provide a semiconductor device for use in a relatively high voltage application. The semiconductor device may include a substrate, a first n-type well region in the substrate to serve as a high voltage n-well (HVNW) for the semiconductor device, a pair of second n-type well regions in the first n-type well region, a p-type region in the first n-type well region between the second n-type well regions, a pair of conductive regions on the substrate between the second n-type well regions, and a number of n-type regions to serve as n-type buried layers (NBLs) for the semiconductor device, wherein the NBLs are located below the first n-type region and dispersed in the substrate.

Some examples of the present invention may also provide a semiconductor device for use in a relatively high voltage application. The semiconductor device may include a substrate, a first n-type well region in the substrate to serve as a high voltage n-well (HVNW) for the semiconductor device, a pair of second n-type well regions in the first n-type well region, a p-type region in the first n-type well region between the second n-type well regions, a pair of conductive regions on the substrate between the second n-type well regions, and a number of n-type regions located below the first n-type region to serve as n-type buried layers (NBLs) for the semiconductor device, wherein the NBLs include first NBLs distributed under the p-type region distributed at a first density and second NBLs distributed at other regions in the substrate at a second density, the first density being greater than the second density.

Examples of the present invention may still provide a semiconductor device for use in a relatively high voltage application. The semiconductor device may include a substrate, a first n-type well region in the substrate to serve as a high voltage n-well (HVNW) for the semiconductor device, a pair of second n-type well regions in the first n-type well region, a p-type region in the first n-type well region between the second n-type well regions, a pair of conductive regions on the substrate between the second n-type well regions, and a number of n-type regions located below the first n-type region to serve as n-type buried layers (NBLs) for the semiconductor device, wherein the NBLs include first NBLs distributed under the p-type region and second NBLs distributed at other regions in the substrate, and wherein the concentration of each of the first NBLs is greater than that of each of the second NBLs.

Additional features and advantages of the present invention will be set forth in portion in the description which follows, and in portion will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, examples are shown in the drawings. It should be understood, however, that the invention is not limited to the precise arrangements and instrumentalities shown in the examples.

In the drawings.

DETAILED DESCRIPTION OF THE INVENTION

Reference will now be made in detail to the present examples of the invention, which are illustrated in the accompanying drawings. Wherever possible, the same reference numbers will be used throughout the drawings to refer to the same or like portions.

Figure 2A:
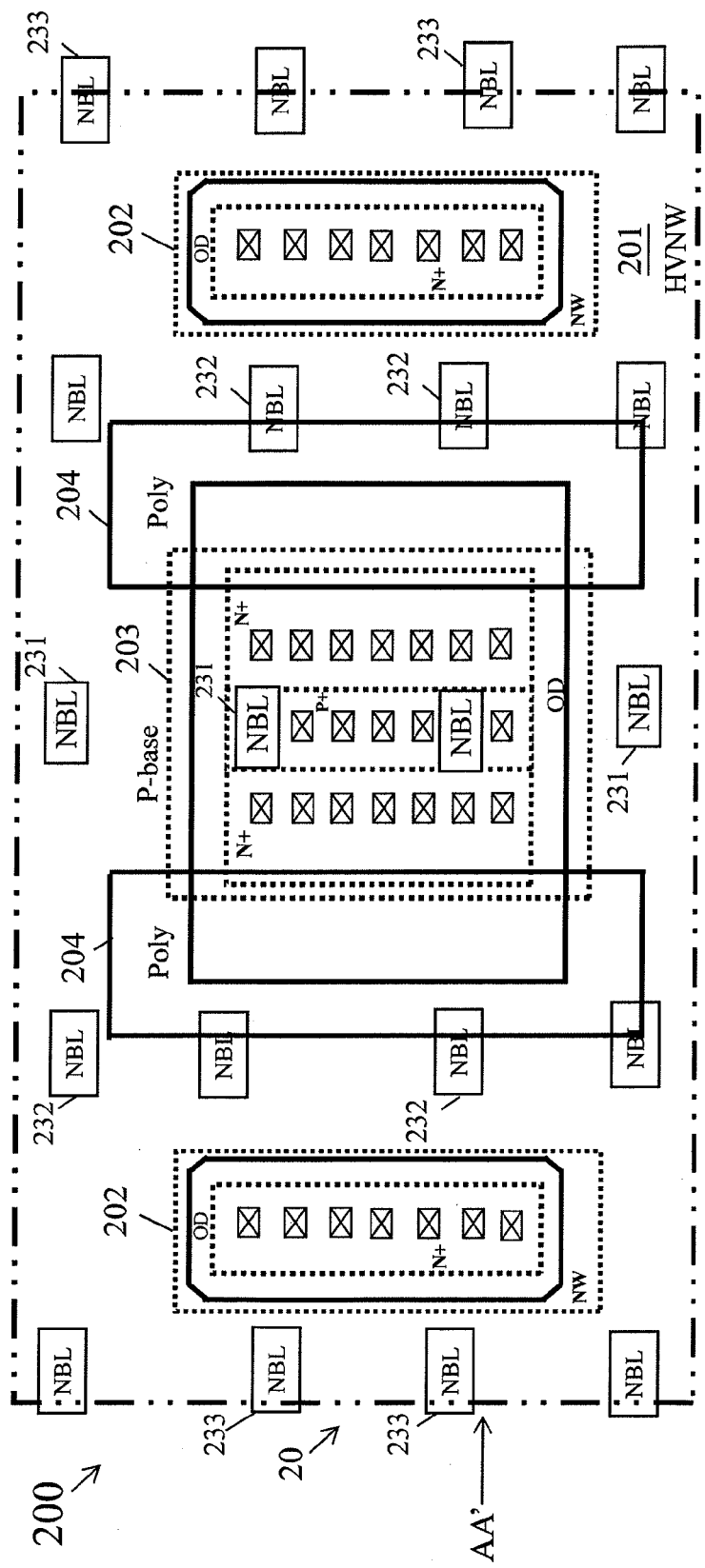
FIG. 2A is a layout of a semiconductor device in accordance with an example of the present invention.

FIG. 2A is a layout of a semiconductor device 200 in accordance with an example of the present invention. The semiconductor device 200 may serve as a power transistor such as a lateral (double) diffused metal-oxide-semiconductor (LDMOS) transistor or a drain extension MOS (DEMOS) transistor for a high-voltage application. Referring to FIG. 2A, the semiconductor device 200 may include a first n-well (HVNW) region 201 such as a high voltage n-well (HVNW) in a substrate 20, a pair of second n-well regions 202 in the first HVNW 201, a p-type region 203 in the first HVNW 201 between the pair of second n-well regions 202, a pair of conductive regions 204 on the substrate 20, and a number of n-type buried layers (NBLs) 231, 232 and 233 dispersed below the first NW 201. Specifically, first NBLs 231 may be located substantially under the p-type region 203, second NBLs 232 may be located substantially under a region between the p-type region 203 and each of the second n-well regions 202, and third NBLs 233 may be located substantially under a region between a peripheral of the first HVNW 201 and each of the second n-well regions 202.

Figure 1:
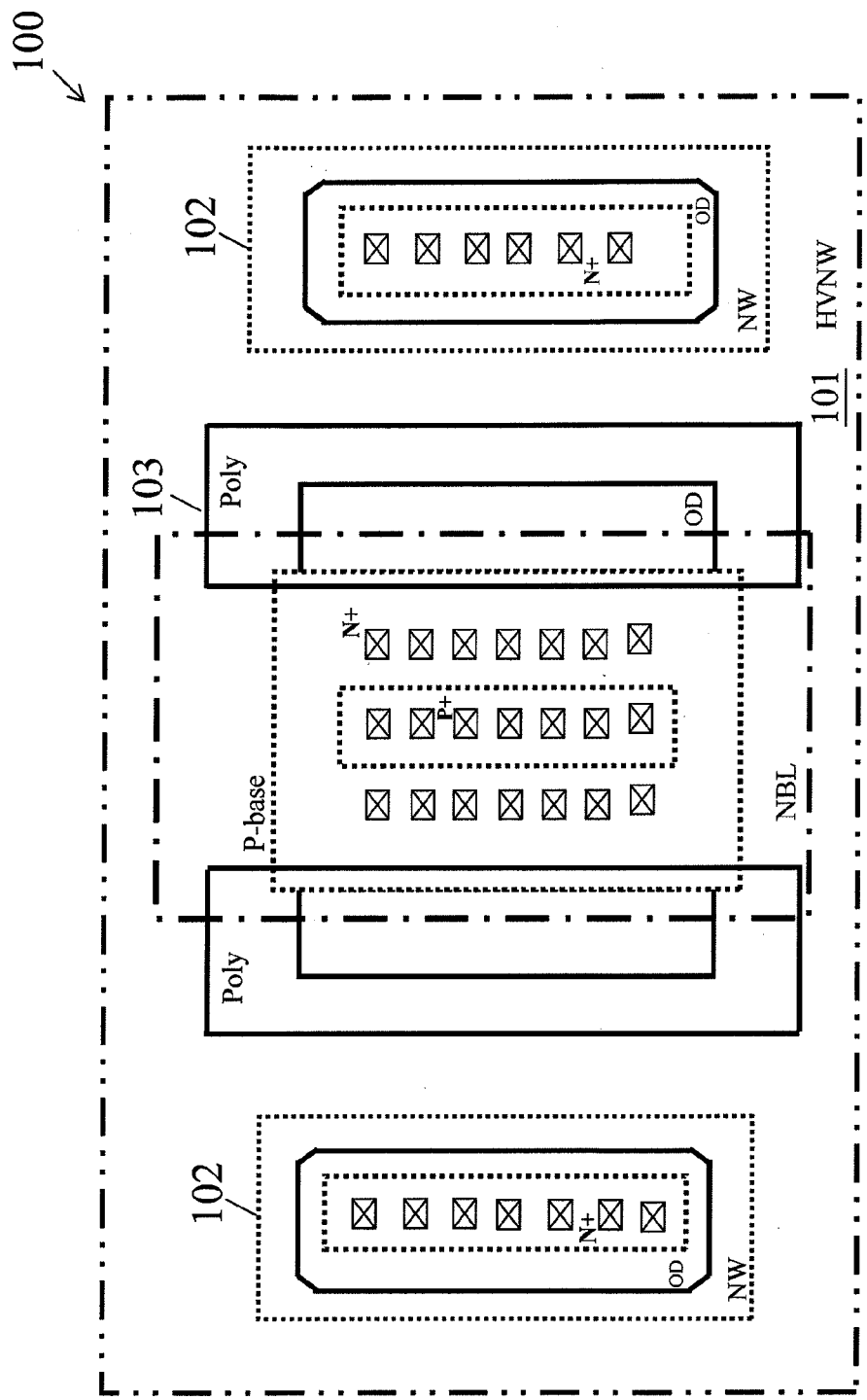
FIG. 1 is a layout of a lateral diffused metal-oxide-semiconductor (LDMOS) device in prior art.

Unlike the single NBL region 103 illustrated in FIG. 1, the multiple NBLs 231, 232 and 233 dispersed below the first HVNW 201 may help raise the breakdown voltage (BV) of the semiconductor device 200 from, for example, approximately 60 volts (V) to approximately 65V. As previously discussed, an increase in the concentration of the HVNW (the first NW 201 in the present example) may result in a decrease in the breakdown voltage, which may thus fall below an acceptable value. In the case that the breakdown voltage is raised from 60V to 65V, the 5V increment may facilitate a decrease in the on-resistance of the semiconductor device 200 by increasing the concentration of the first HVNW 201. Specifically, despite that the 5V increment may consequently be offset as the concentration of the first HVNW 201 increases, that is, the breakdown voltage may fall back to the 60V, which, however, is an acceptable value for a 40V application, the on-resistance is reduced.

The NBLs 231, 232 and 233 may be formed by implanting n-type impurity from respective mask windows. In one example, the total area of the mask windows associated with the NBLs 231 to 233 may be equal to the area of the mask window associated with the NBL 103 illustrated in FIG. 1.

In the present example, the NBLs 231, 232 and 233 may be uniformly distributed below the first HVNW 201. Accordingly, the density and the resultant concentration of the NBLs 231, 232 and 233 may be substantially the same.

Figure 2B:
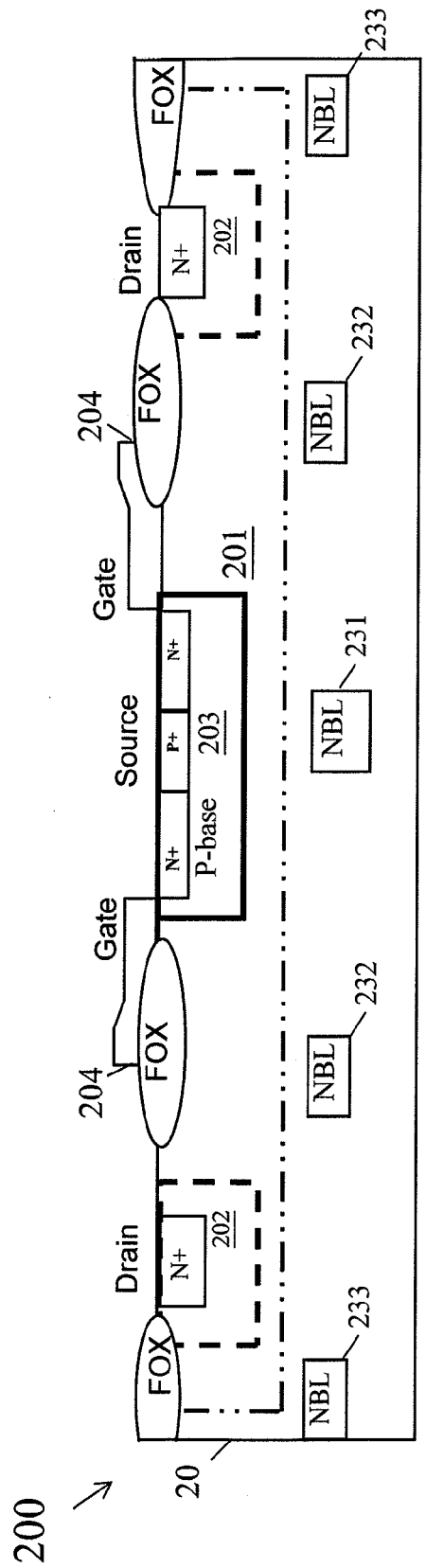
FIG. 2B is a cross-sectional view of the semiconductor device taken along a line AA' in FIG. 2A.

FIG. 2B is a cross-sectional view of the semiconductor device 200 taken along a line AA' in FIG. 2A. Referring to FIG. 2B, the p-type region 203, which may serve as a base for the semiconductor device 200, may further include a pair of heavily doped n-type (n$^+$) regions (not numbered) and a heavily doped p-type (p$^+$) region (not numbered) between the n$^+$ regions. The heavily doped n-type and p-type regions in the p-type base 203 may serve as a source region. Furthermore, a number of contacts (not numbered) may be formed on the source region to serve as source terminals.

The pair of second n-well regions 202 may each further include a heavily doped n-type (n$^+$) region (not numbered), which serves as a drain region for the semiconductor device 200. Furthermore, a number of contacts (not numbered) may be formed on the drain regions to serve as drain terminals.

The pair of conductive regions 204, which may include poly-silicon, may serve as gate terminals for the semiconductor device 200. One of the conductive regions 204 may be located on the substrate 20 substantially between the source region and one of the drain regions, and the other one of the conductive regions 204 may be located on the substrate 20 substantially between the source region and the other one of the drain regions.

Moreover, insulation regions (labeled "OD" in FIG. 2A) such as field oxide (FOX) may be located on the substrate 20 to boost the safe operation area (SOA) in a device.

Figure 3A:
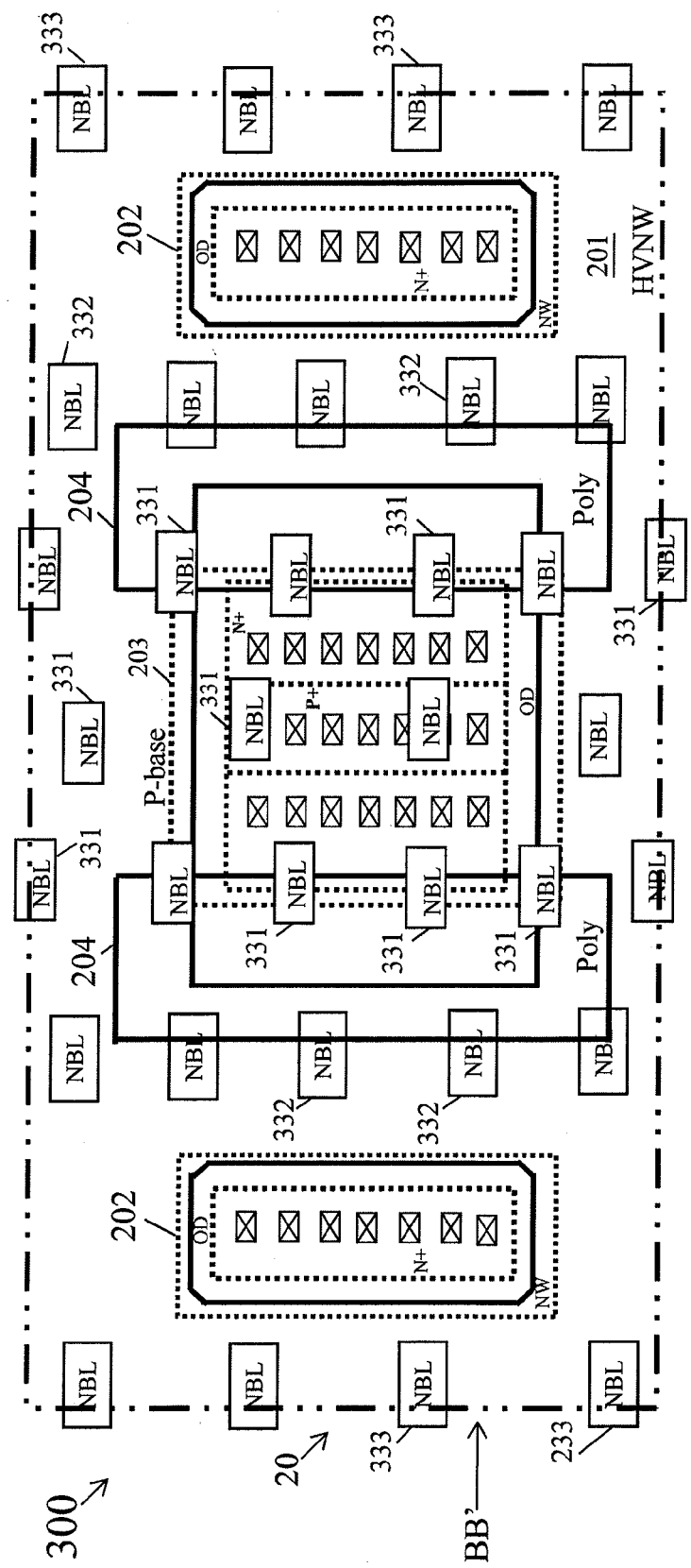
FIG. 3A is a layout of a semiconductor device in accordance with another example of the present invention.

FIG. 3A is a layout of a semiconductor device 300 in accordance with another example of the present invention. Referring to FIG. 3A, the semiconductor device 300 may be similar to the semiconductor device 200 described and illustrated with reference to FIG. 2A except, for example, the distribution of NBLs 331, 332 and 333. Specifically, first NBLs 331, located substantially under the p-type region 203, may be distributed at a first density. Furthermore, second NBLs 332, located substantially under a region between the p-type region 203 and each of the second n-well regions 202, may be distributed at a second density. Moreover, third NBLs 333, located substantially under a region between a peripheral of the first HVNW 201 and each of the second n-well regions 202, may be distributed at a third density. In the present example, the first density may be greater than each of the second density and third density. Moreover, the second density may be greater than the third density. For example, given a 40V application, the first NBLs 331 may be separated from one another by approximately 1 micrometer (um), the second NBLs 332 may be separated from one another by approximately 1 to 2 um, and the third NBLs 333 may be separated from one another by approximately 2 to 3 um.

The resultant concentration of the NBLs 331 to 333 may be positively correlated to the density of distribution. That is, the more densely distributed the NBLs, the greater the resultant concentration. In one example, given the same implantation concentration of $10^{13}$ cm$^{-2}$, the resultant concentration of the first NBLs 331 may be approximately $10^{19}$ to $10^{20}$ cm$^{-3}$, the resultant concentration of the second NBLs 332 may be approximately $10^{17}$ to $10^{19}$ cm$^{-3}$, and the resultant concentration of the third NBLs 333 may be approximately $10^{17}$ cm$^{-3}$. Such NBL distribution may facilitate an increase in breakdown voltage, which in turn may facilitate a decrease in on-resistance.

Figure 3B:
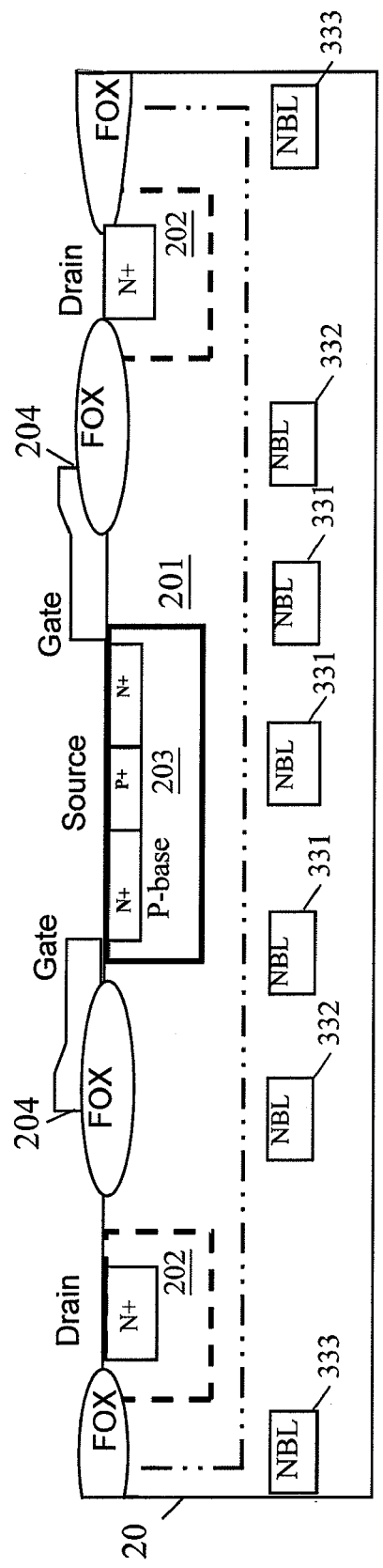
FIG. 3B is a cross-sectional view of the semiconductor device taken along a line BB' in FIG. 3A.

FIG. 3B is a cross-sectional view of the semiconductor device 300 taken along a line BB' in FIG. 3A. Referring to FIG. 3B, the first NBLs 331 under the p-type region 203 are may densely distributed than the second and third NBLs 332 and 333.

Figure 4A:
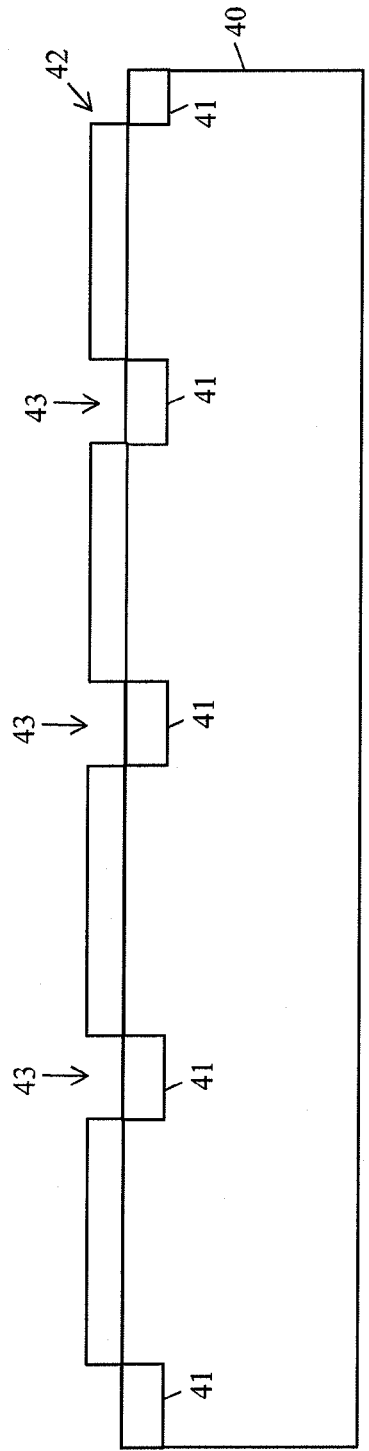
FIGS. 4A to 4H are cross-sectional diagrams illustrating a method of fabricating a semiconductor device in accordance with an example of the present invention.

FIGS. 4A to 4H are cross-sectional diagrams illustrating a method of fabricating a semiconductor device in accordance with an example of the present invention. Referring to FIG. 4A, a substrate 40 formed of silicon, which has been doped with a first-type impurity, is provided. In one example, the first-type impurity may include a p-type material such as boron or indium. Furthermore, the resistivity of the substrate 40 may range from approximately 8 to 12 ohm-cm. In another example, however, the first-type impurity may include an n-type material such as phosphor or antimony. For simplicity, it may be assumed that the first-type impurity is the p-type material and the second-type impurity is the n-type material.

Next, a patterned photo-resist layer 42 is formed on the substrate 40, exposing portions of the substrate 10 through openings 43. The exposed regions of the substrate 40 may be doped with the n-type impurity through the openings 43 in an implantation process followed by a drive-in process, resulting in implanted regions 41. In one example according to the present invention, the concentration of the implanted regions 41 may be approximately $10^{13}$ to $10^{15}$ cm$^{-2}$. Furthermore, the implanted regions 41 may have a thickness of approximately 2 um. The implanted regions 41 may each consequently serve as an n-type buried layer (NBL). The patterned photo-resist layer 42 may then be stripped off.

Figure 4B:
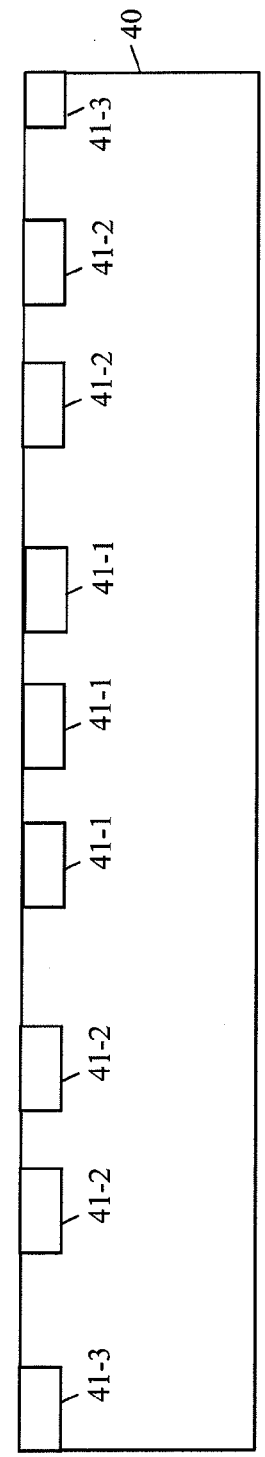

In the present example, as illustrated in FIG. 4A, the implanted regions 41 may be substantially uniformly distributed. In other examples, as illustrated in FIG. 4B, first implanted regions 41-1 near a center area of the substrate surface may be more densely distributed than second implanted regions 41-2 located remote to the center area, which in turn may be more densely distributed than third implanted regions 41-3 located more remote to the center area.

Figure 4C:
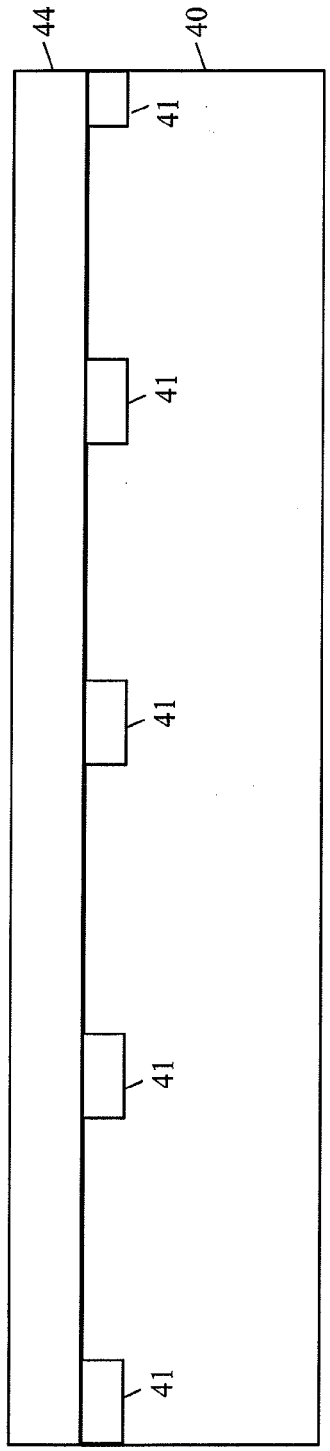

Referring to FIG. 4C, an epitaxial layer 44 of the first-type impurity may be formed on the substrate 40 by, for example, a deposition process. In one example, the epitaxial layer 44 may have a thickness of approximately 5 um with a resistivity of approximately 45 ohm-cm.

Figure 4D:
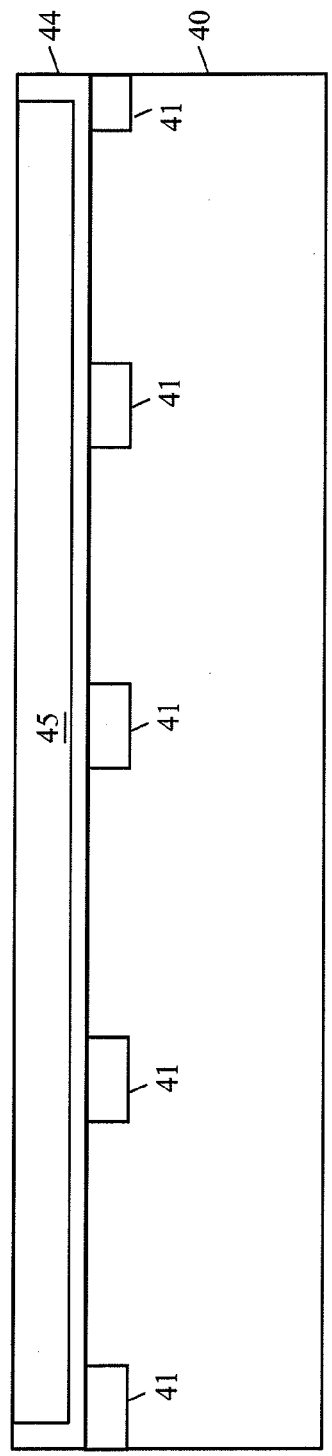

Referring to FIG. 4D, a first well region 45 of the second-type impurity, that is, an n-well 45, may be formed in the epitaxial layer 44 over the NBLs 41 by, for example, a lithography process followed by an n-type implantation process and a thermal drive-in process. In one example, the n-well 45, which may subsequently serve as a HVNW, may have a thickness of approximately 5 um.

Figure 4E:
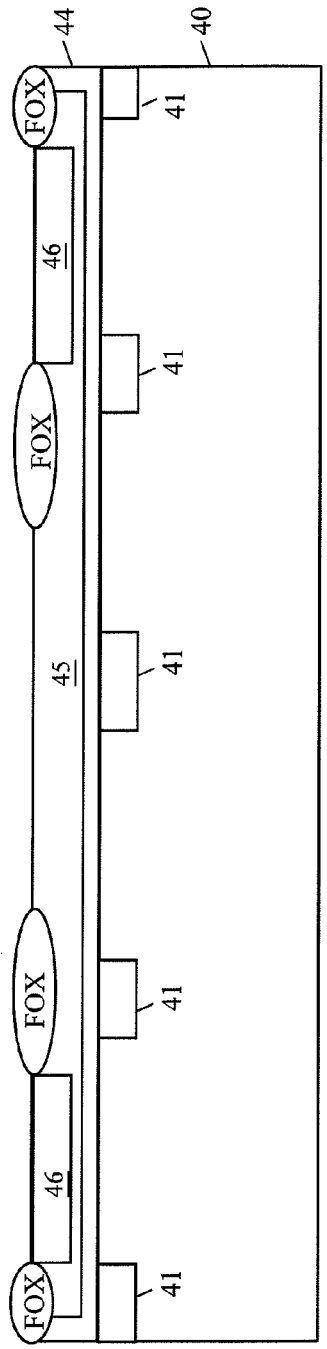

Referring to FIG. 4E, a pair of second n-type well regions 46 of the second impurity type, that is, n-well 46, may be formed in the first n-well 45 by a lithography process followed by an n-type implantation process and a drive-in process. Furthermore, insulation regions such as FOX may be formed at desired locations on the substrate 40 by, for example, a deposition process followed by a thermal oxidation process.

Figure 4F:
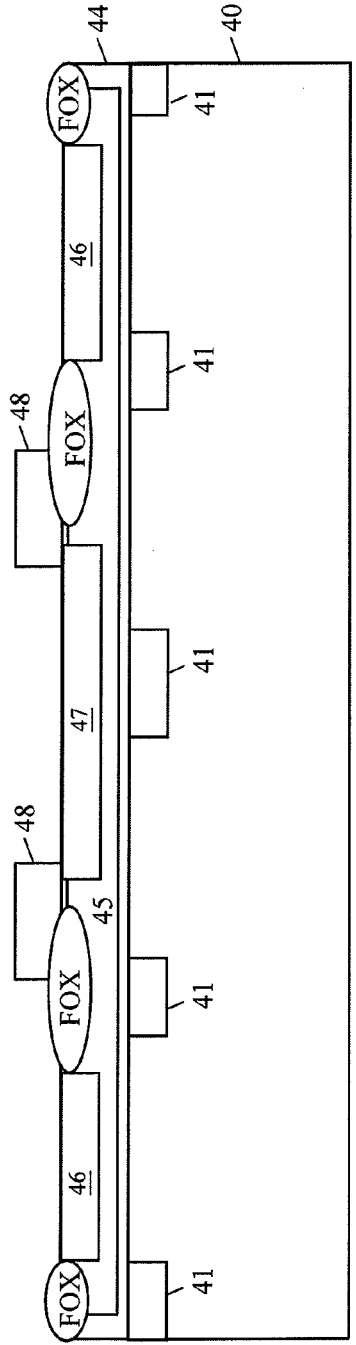

Referring to FIG. 4F, a p-type region 47 to serve as a base region between the second n-wells 46 may be formed in the first n-well 45 by a lithography process followed by a p-type implantation process and a drive-in process. Next, a patterned conductive layer 48 to serve as gate terminals may be formed by a deposition process followed by an etch process.

Figure 4G:
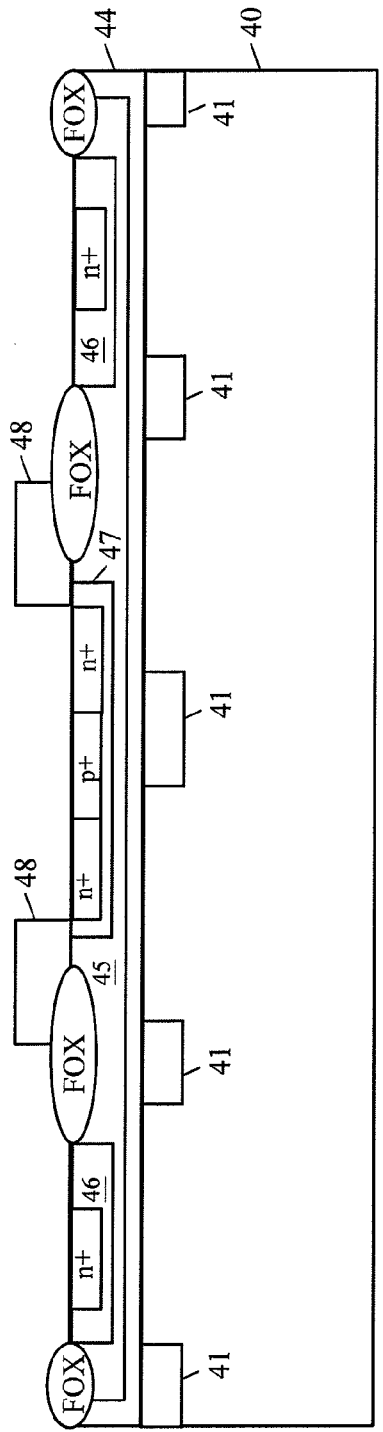

Referring to FIG. 4G, heavily doped n-type (n$^+$) regions may be formed in the second n-wells 46 and the p-type region 47 by an implanting process. The n$^+$ regions in the second n-wells 46 may serve as drain regions. Furthermore, a heavily doped p-type (p$^+$) region may be formed in the p-type base 47 between the n$^+$ regions, resulting in a source region.

Figure 4H:
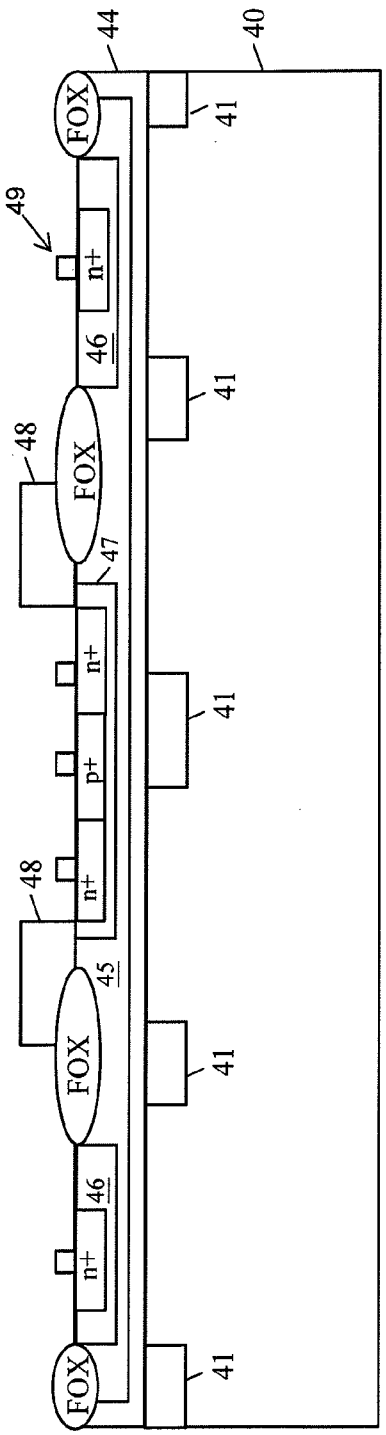

Referring to FIG. 4H, another patterned conductive layer 49 may be formed on the second n-wells 46 and p-type region 46, resulting in drain and source terminals for the semiconductor device.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A semiconductor device for use in a relatively high voltage application, the semiconductor device comprising:
    a substrate;
    a first n-type well region in the substrate to serve as a high voltage n-well (HVNW) for the semiconductor device;
    a pair of second n-type well regions in the first n-type well region;
    a first p-type region in the first n-type well region between the second n-type well regions;
    a pair of conductive regions on the substrate between the second n-type well regions; and
    a number of n-type regions to serve as n-type buried layers (NBLs) for the semiconductor device,
    wherein the NBLs are located below the first n-type region, dispersed in the substrate, and uniformly distributed in the substrate under the first n-type well region, and wherein the NBLs includes first NBLs located under the p-type region and second NBLs located under a region between the p-type region and each of the second n-type well regions, the first NBLs are distributed at a first density and the second NBLs are distributed at a second density, the first density being greater than the second density.

2. The semiconductor of claim 1 further comprising third NBLs located under a region between a peripheral of the first n-type well region and each of the second n-type well regions, wherein the third NBLs are distributed at a third density, the third density being smaller than the first density.

3. The semiconductor of claim 1 further comprising third NBLs located under a region between the peripheral of the first n-type well region and each of the second n-type well regions, wherein the third NBLs are distributed at a third density, the third density being smaller than the second density.

4. The semiconductor device of claim 1, wherein each of the first NBLs has a first concentration and each of the second NBLs has a second concentration, the first concentration being greater than the second concentration.

5. The semiconductor of claim 4 further comprising third NBLs located under a region between the peripheral of the first n-type well region and each of the second n-type well regions, wherein each of the third NBLs has a third concentration, the third concentration being smaller than the first concentration.

6. The semiconductor of claim 4 further comprising third NBLs located under a region between the peripheral of the first n-type well region and each of the second n-type well regions, wherein each of the third NBLs has a third concentration, the third concentration being smaller than the second concentration.

7. The semiconductor device of claim 1, wherein the pair of second n-type well regions serve as drain regions and the first p-type region includes a pair of n-type regions and a second p-type region to serve as source regions.

8. A semiconductor device for use in a relatively high voltage application, the semiconductor device comprising:
    a substrate;
    a first n-type well region in the substrate to serve as a high voltage n-well (HVNW) for the semiconductor device;
    a pair of second n-type well regions in the first n-type well region;
    a p-type region in the first n-type well region between the second n-type well regions;
    a pair of conductive regions on the substrate between the second n-type well regions; and
    a number of n-type regions located below the first n-type region to serve as n-type buried layers (NBLs) for the semiconductor device, wherein the NBLs include first NBLs distributed under the p-type region distributed at a first density and second NBLs distributed at other regions in the substrate at a second density, the first density being greater than the second density.

9. The semiconductor device of claim 8, wherein each of the first NBLs has a first concentration and each of the second NBLs has a second concentration, the first concentration being greater than the second concentration.

10. The semiconductor device of claim 8, wherein the second NBLs include a first group of NBLs located under a region between the p-type region and each of the second n-type well regions and a second group of NBLs located under a region between a peripheral of the first n-type well region and each of the second n-type well regions, the first group of NBLs being more densely distributed than the second group of NBLs.

11. The semiconductor device of claim 8, wherein the second NBLs include a first group of NBLs located under a region between the p-type region and each of the second n-type well regions and a second group of NBLs located under a region between a peripheral of the first n-type well region and each of the second n-type well regions, the concentration of each of the first group of NBLs being greater than that of each of the second group of NBLs.

12. A semiconductor device for use in a relatively high voltage application, the semiconductor device comprising:
   a substrate;
   a first n-type well region in the substrate to serve as a high voltage n-well (HVNW) for the semiconductor device;
   a pair of second n-type well regions in the first n-type well region;
   a p-type region in the first n-type well region between the second n-type well regions;
   a pair of conductive regions on the substrate between the second n-type well regions; and
   a number of n-type regions located below the first n-type region to serve as n-type buried layers (NBLs) for the semiconductor device, wherein the NBLs include first NBLs distributed under the p-type region and second NBLs distributed at other regions in the substrate, and wherein the concentration of each of the first NBLs is greater than that of each of the second NBLs.

13. The semiconductor device of claim 12, wherein the first NBLs are distributed at a first density and the second NBLs are distributed at a second density, the first density being greater than the second density.

14. The semiconductor device of claim 12, wherein the second NBLs include a first group of NBLs located under a region between the p-type region and each of the second n-type well regions and a second group of NBLs located under a region between a peripheral of the first n-type well region and each of the second n-type well regions, the first group of NBLs being more densely distributed than the second group of NBLs.

15. The semiconductor device of claim 12, wherein the second NBLs include a first group of NBLs located under a region between the p-type region and each of the second n-type well regions and a second group of NBLs located under a region between a peripheral of the first n-type well region and each of the second n-type well regions, the concentration of each of the first group of NBLs being greater than that of each of the second group of NBLs.

* * * * *